(12) United States Patent
Jacob et al.

(10) Patent No.: US 10,026,659 B2
(45) Date of Patent: Jul. 17, 2018

(54) METHODS OF FORMING FIN ISOLATION REGIONS UNDER TENSILE-STRAINED FINS ON FINFET SEMICONDUCTOR DEVICES

(71) Applicant: GLOBALFOUNDRIES Inc., Grand Cayman (KY)

(72) Inventors: Ajey Poovannummoottil Jacob, Watervliet, NY (US); Murat Kerem Akarvardar, Saratoga Springs, NY (US); Jody A. Fronheiser, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 69 days.

(21) Appl. No.: 14/608,815

(22) Filed: Jan. 29, 2015

(65) Prior Publication Data
US 2016/0225676 A1    Aug. 4, 2016

(51) Int. Cl.
| | |
|---|---|
| *H01L 21/00* | (2006.01) |
| *H01L 21/84* | (2006.01) |
| *H01L 29/165* | (2006.01) |
| *H01L 21/762* | (2006.01) |
| *H01L 21/8238* | (2006.01) |
| *H01L 21/02* | (2006.01) |

(52) U.S. Cl.
CPC ...... *H01L 21/845* (2013.01); *H01L 21/76264* (2013.01); *H01L 21/823807* (2013.01); *H01L 21/823821* (2013.01); *H01L 21/823878* (2013.01); *H01L 29/165* (2013.01); *H01L 21/02236* (2013.01); *H01L 21/02255* (2013.01)

(58) Field of Classification Search
CPC ........... H01L 29/7851; H01L 29/66795; H01L 21/845; H01L 21/76264; H01L 21/823807; H01L 21/823821; H01L 21/823878; H01L 29/165; H01L 21/02236; H01L 21/02255

USPC ....................................................... 438/154
See application file for complete search history.

(56) References Cited

U.S. PATENT DOCUMENTS

| | | | |
|---|---|---|---|
| 9,196,479 B1 * | 11/2015 | Cheng ............. | H01L 21/823807 |
| 2008/0073667 A1 * | 3/2008 | Lochtefeld ........ | H01L 29/66795 |
| | | | 257/190 |

(Continued)

OTHER PUBLICATIONS

Simpson and Weiner, "The Oxford English Dictionary", 1989, Clarendon Press, V 20.*
Cheng et al., "Aspect Ratio Trapping Heteroepitaxy for Integration of Germanium and Compound Semiconductors on Silicon," IEEE 2008.
Houghton et al., "Equilibrium critical thickness for Si1-xGex strained layers on (100) Si," Appl. Phys. Lett., 56:460-62, Jan. 1990.
Jain et al., "A new study of critical layer thickness, stability and strain relaxation in pseudomorphic GexSi1-x strained epilayers," Philosophical Magazine A, 65:1151-67, 1992.

(Continued)

*Primary Examiner* — Mohsen Ahmadi
*Assistant Examiner* — Patricia Reddington
(74) *Attorney, Agent, or Firm* — Amerson Law Firm, PLLC

(57) ABSTRACT

One illustrative method disclosed herein includes, among other things, forming a composite fin structure that is comprised of a first germanium-containing semiconductor material having a first concentration of germanium and a tensile-strained second semiconductor material (having a lesser germanium concentration) positioned on the first germanium-containing semiconductor material and performing a thermal anneal process to convert the first germanium-containing semiconductor material portion of the composite fin structure into a germanium-containing oxide isolation region positioned under the second semiconductor material that is a tensile-strained final fin for an NMOS FinFET device.

22 Claims, 10 Drawing Sheets

(56) References Cited

U.S. PATENT DOCUMENTS

| | | |
|---|---|---|
| 2009/0321836 A1 | 12/2009 | Wei et al. |
| 2010/0072515 A1 | 3/2010 | Park et al. |
| 2011/0097881 A1 | 4/2011 | Vandervorst et al. |
| 2011/0183508 A1 | 7/2011 | Chan et al. |
| 2013/0270628 A1* | 10/2013 | Huang ............... H01L 29/0847 257/329 |
| 2014/0151814 A1* | 6/2014 | Giles ............... H01L 21/823821 257/369 |
| 2014/0353767 A1* | 12/2014 | Liu ..................... H01L 21/845 257/401 |
| 2015/0024573 A1 | 1/2015 | Jacob et al. |
| 2015/0295089 A1* | 10/2015 | Huang ............... H01L 29/7853 257/401 |
| 2015/0303198 A1* | 10/2015 | Ching ................ H01L 29/16 257/192 |

OTHER PUBLICATIONS

Kasper et al., "Strain relaxation of metastable SiGe/Si: Investigation with two complementary X-ray techniques," Journal of Applied Physics, 111:063507, 2012.

Kim et al., "Increased critical thickness for high Ge-content strained SiGe-on-Si using selective epitaxial growth," Applied Physics Letters, 97:262106, 2012.

Paul, "Silicon-Germanium Strained Layer Materials in Microelectronics," Advanced Materials, 11:191-204, 1999.

Paul, "Si/SiGe heterostructures: From material and physics to devices and circuits," Review Article submitted to Semicond. Sci. Technol.

* cited by examiner

METHODS OF FORMING FIN ISOLATION REGIONS UNDER TENSILE-STRAINED FINS ON FINFET SEMICONDUCTOR DEVICES

BACKGROUND OF THE INVENTION

1. Field of the Invention

Generally, the present disclosure relates to the manufacturing of semiconductor devices, and, more specifically, to various methods of forming fin isolation regions under tensile-strained fins on FinFET semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1A is a perspective view of an illustrative prior art FinFET semiconductor device 10 that is formed above a semiconductor substrate 12 at an intermediate point during fabrication. In this example, the FinFET device 10 includes three illustrative fins 14, an isolation material 15, a gate structure 18, sidewall spacers 20 and a gate cap layer 22. The fins 14 have a three-dimensional configuration: a height H, a width W and an axial length L. The portions of the fins 14 covered by the gate structure 18 are the channel regions of the FinFET device 10, while the portions of the fins 14 positioned laterally outside of the spacers 20 are part of the source/drain regions of the device 10. Although not depicted, the portions of the fins 14 in the source/drain regions may have additional epi semiconductor material formed thereon in either a merged or unmerged condition. FIG. 1B is a TEM photograph showing one illustrative example of a FinFET device wherein the fins 14 are vertically separated from the substrate 12 by the isolation material 15.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers are currently investigating alternative semiconductor materials, such as so-called SiGe, Ge and III-V materials, to manufacture FinFET devices, which are intended to enhance the performance capabilities of such devices, e.g., to enable low-voltage operation without degrading their operating speed, by improving the mobility of the charge carriers in such devices.

However, the integration of such alternative materials on silicon substrates (the dominant substrates used in the industry) is non-trivial due to, among other issues, the large difference in lattice constants between such alternative materials and silicon. With respect to forming such lattice-mismatched materials on one another, there is a concept that is generally referred to as the "critical thickness" of a material. The term "critical thickness" generally refers to materials that are in one of three conditions, i.e., so-called "stable," "metastable" or "relaxed-with-defects" conditions. These three conditions also generally reflect the state of the strain on the material. That is, a stable material is in a fully-strained condition that is 100% strained in at least one crystalline plane of the material.

FIG. 1C is a graph taken from an article entitled "Silicon-Germanium Strained Layer Materials in Microelectronics" by Douglas J. Paul that was published in *Advanced Materials* magazine (11(3), 101-204 (1999)). FIG. 1C graphically depicts these three conditions for blank (unpatterned) silicon-germanium materials ($Si_{1-x}Ge_x$; x=0-1). The vertical axis is the critical thickness in nanometers. The horizontal axis is the concentration of germanium in the silicon-germanium material. At the leftmost point on the horizontal axis is pure silicon (Ge concentration equals 0.0). At the rightmost point on the horizontal axis is pure germanium (Ge concentration equals 1.0). The two curves R and S define the stable, metastable and relaxed-with-defects regions for silicon-germanium materials having differing germanium concentration levels. Above and to the right of curve R are materials that are in the relaxed-with-defects condition. Below and to the left of the curve S are materials that are in the stable condition. The region between the two curves R and S defines the region where materials are in the metastable condition.

With reference to FIG. 1C, a layer of pure germanium (Ge concentration equal to 1.0) may be in the stable condition at a thickness up to about 1-2 nm (point CT1) and it may relax beyond about 4 nm (point CT2). Between about 2-4 nm, germanium is in a so-called "metastable condition" meaning it can easily relax if it is subjected to a relatively high temperature anneal. In contrast, a layer of silicon-germanium with a 50% concentration of germanium may be in the stable condition at thicknesses up to about 4 nm (point CT3) and it may be in a metastable condition for thicknesses between about 4-30 nm (point CT4). Above a thickness of about 30 nm, a layer of silicon-germanium with a 50% concentration of germanium will be in the relaxed-with-defects condition.

Lastly, it is known that NMOS device performance is enhanced when the channel material is tensile-strained, and that PMOS device performance is enhanced when the channel region is under a compressive strain. The problem is that, in traditional manufacturing techniques, fins for all of the devices (both N and P) are formed at the same time across the substrate so as to enable precise formation of the fins without concern for dimensional variations in the fins due to so-called etch loading effects. Thus, using prior art manufacturing techniques, the formation of fins with acceptable strain conditions for both N and P type devices is problematic.

The present disclosure is directed to various methods of forming fin isolation regions on FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fin isolation regions under tensile-strained fins on FinFET semiconductor devices. One illustrative method disclosed herein includes, among other things, forming a composite fin structure that is at least partially positioned in a layer of insulating material formed above a semiconductor substrate material, the composite fin structure comprising a first germanium-containing semiconductor material having a first concentration of germanium positioned on a surface of the semiconductor substrate material and a second tensile-strained semiconductor material positioned on a surface of the first germanium-containing semiconductor material, wherein a concentration of germanium in the second semiconductor material is less than the first concentration of germanium, and performing a thermal anneal process to convert the first germanium-containing semiconductor material portion of composite fin structure into a germanium-containing oxide isolation region positioned under the second semiconductor material of the composite fin structure, wherein the second semiconductor material is a tensile-strained final fin for an NMOS FinFET device.

BRIEF DESCRIPTION OF THE DRAWINGS

The disclosure may be understood by reference to the following description taken in conjunction with the accompanying drawings, in which like reference numerals identify like elements, and in which.

Figure 1A:
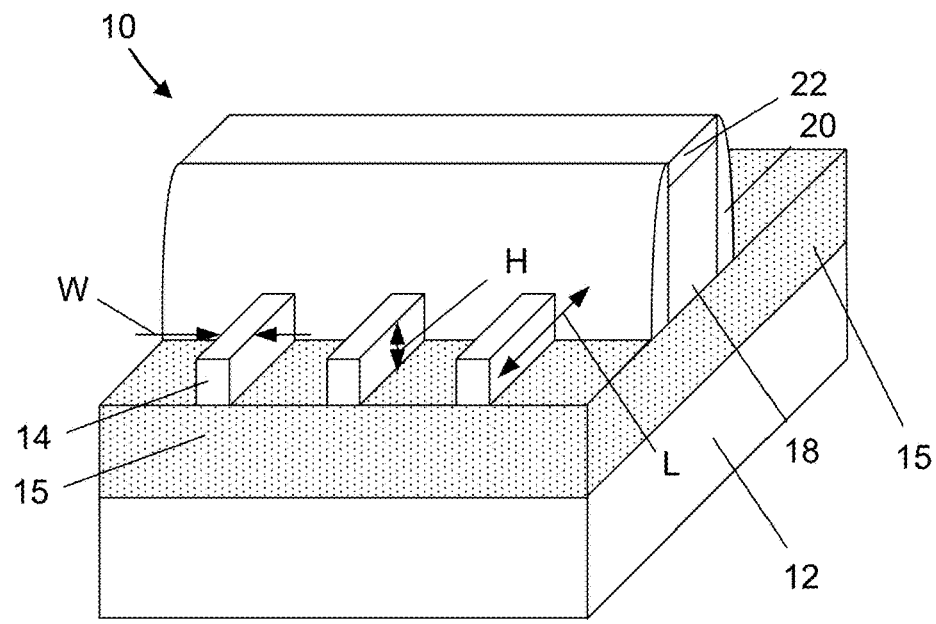
FIGS. 1A-1C depict one illustrative prior art method of forming fin isolation regions when forming FinFET semiconductor devices and the critical thickness of various materials that may be used for the channel region of such devices.
Figure 1B:
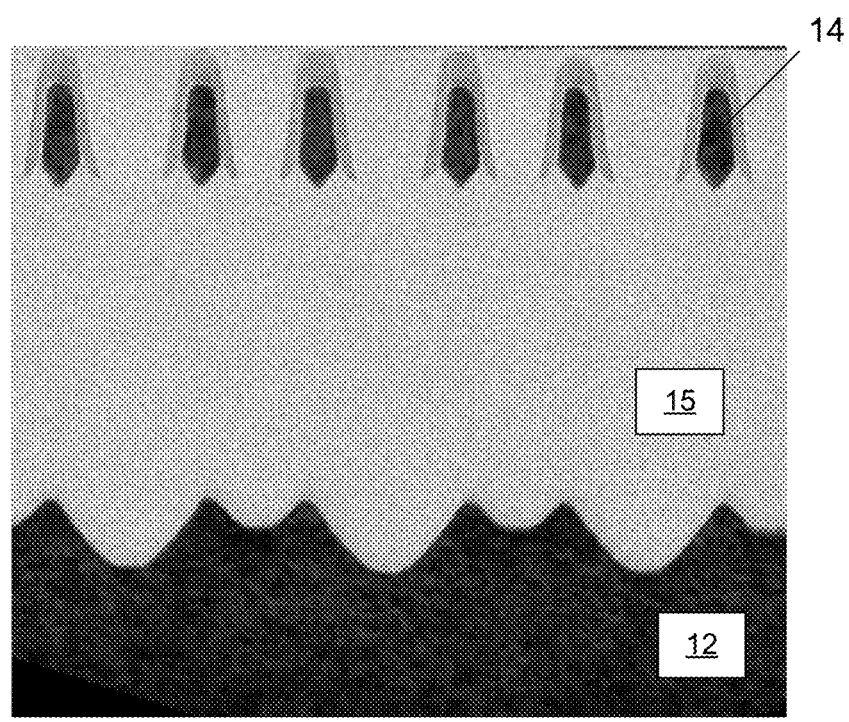
Figure 1C:
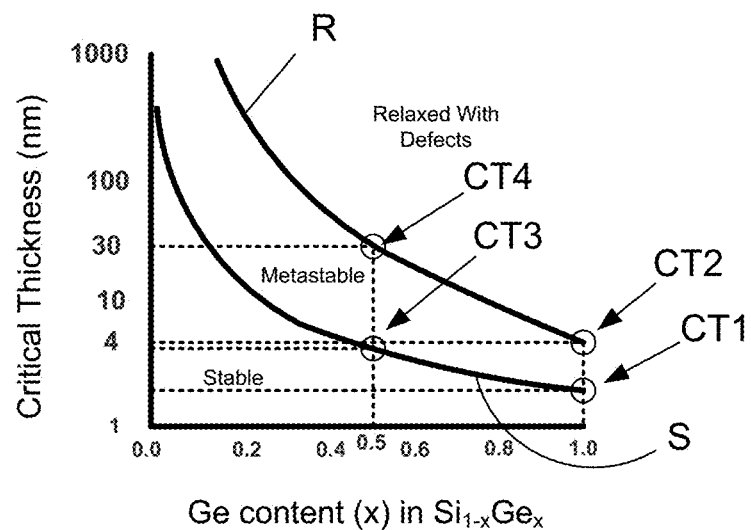

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fin isolation regions under tensile-strained fins on FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

The integrated circuit products 100 depicted herein are formed in and on a semiconducting substrate 102, such as a bulk substrate or an active layer of an SOI type substrate. The substrate 102 may be made of silicon or it may be made of materials other than silicon. Thus, the terms "substrate" or "semiconducting substrate" should be understood to cover all forms of all semiconductor materials. As will be recognized by those skilled in the art after a complete reading of the present application, the illustrative integrated circuit product 100 may be comprised of a plurality of N-type FinFET devices and/or a plurality of P-type FinFET devices.

As will be appreciated by those skilled in the art after a complete reading of the present application, various doped regions, e.g., source/drain regions, halo implant regions, well regions and the like, for the devices are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
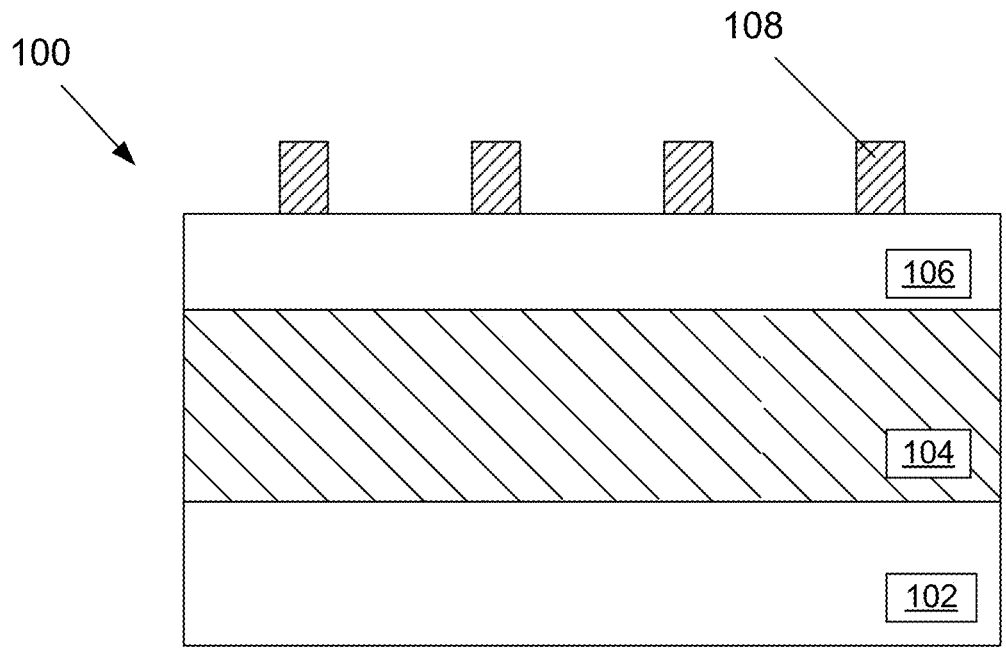
FIGS. 2A-2K depict various illustrative methods disclosed herein for forming fin isolation regions under tensile-strained fins on FinFET semiconductor devices.

FIGS. 2A-2K depict various illustrative methods disclosed herein for forming fin isolation regions under tensile-strained fins on FinFET semiconductor devices. FIG. 2A depicts the product 100 after several process operations were performed. First, a germanium-containing semiconductor material layer 104 was formed on the substrate 102 by performing an epitaxial deposition process. The layer 104 may sometimes be referred to as a "virtual" substrate within the industry. Next, a layer of semiconductor material 106 was formed on the germanium-containing semiconductor material layer 104. Also depicted in FIG. 2A is a patterned hard mask layer 108 that was formed above the layer of semiconductor material 106. The patterned hard mask layer 108 is intended to be representative in nature as it could be comprised of a variety of materials, such as, for example, a photoresist material, silicon nitride, silicon oxynitride, silicon dioxide, etc. Moreover, the patterned hard mask layer 108 could be comprised of multiple layers of material, such as, for example, a pad oxide layer (not separately shown) and a pad silicon nitride layer (not separately shown) that is formed on the pad oxide layer. Thus, the particular form and composition of the patterned hard mask layer 108 and the manner in which it is made should not be considered a limitation of the presently disclosed inventions.

The germanium-containing semiconductor material layer 104 and the layer of semiconductor material 106 may be formed by performing known epitaxial deposition processes. In general, in the case where the substrate 102 is made of silicon, the germanium concentration of the layer of semiconductor material 106 will be less than the germanium concentration of the germanium-containing semiconductor material layer 104 so as to thereby induce a tensile strain in the layer of semiconductor material 106 when it is formed. In one embodiment, the germanium concentration of the layer of semiconductor material 106 should be at least about 15-60% less than the germanium concentration of the germanium-containing semiconductor material layer 104 so as to impart the desired tensile strain on the layer of semiconductor material 106 when it is formed. The germanium-containing semiconductor material layer 104 is formed so as to be in a fully relaxed condition (in at least one direction and in one particular example, only in one direction, i.e., it is formed to a thickness that is greater than its critical thickness). The thickness of the layer of semiconductor material 106 may vary depending upon the desired final height of the fins that will be formed, as described more fully below, e.g., 20-50 nm. In one illustrative example, the germanium-containing semiconductor material layer 104 may be comprised of $Si_xGe_{(1-x)}$ (where x ranges from zero to about 0.75). In one particular embodiment, the germanium-containing semiconductor material layer 104 may be a fully relaxed layer of silicon-germanium ($SiGe_{0.5}$), while the layer of semiconductor material 106 may be a layer of substantially pure silicon that is substantially free of germanium. In another embodiment, the germanium-containing semiconductor material layer 104 may be a layer of substantially pure germanium (i.e., x=0), while the layer of semiconductor material 106 may be a layer of silicon-germanium having a germanium concentration that is less than the germanium concentration of the germanium-containing semiconductor material layer 104, e.g., $SiGe_{0.25}$ (for the layer 104)/Si (for the layer 106); $SiGe_{0.40}$/Si; $SiGe_{0.40}$/$SiGe_{0.15}$; or Ge/$SiGe_{0.85}$. Based upon the lattice constants of the various layers of material, and the fully relaxed nature of the germanium-containing semiconductor material layer 104, the layer of semiconductor material 106 will be formed with a tensile strain. The magnitude of the tensile strain on the layer 106 will depend upon a variety of factors, including how much less germanium is contained in the layer 106 relative to the layer 104. Among other factors, the greater the difference in germanium concentration, the greater will be the magnitude of the tensile strain on the layer of material 106 due to the lattice mismatch between the materials 104 and 106.

Figure 2B:
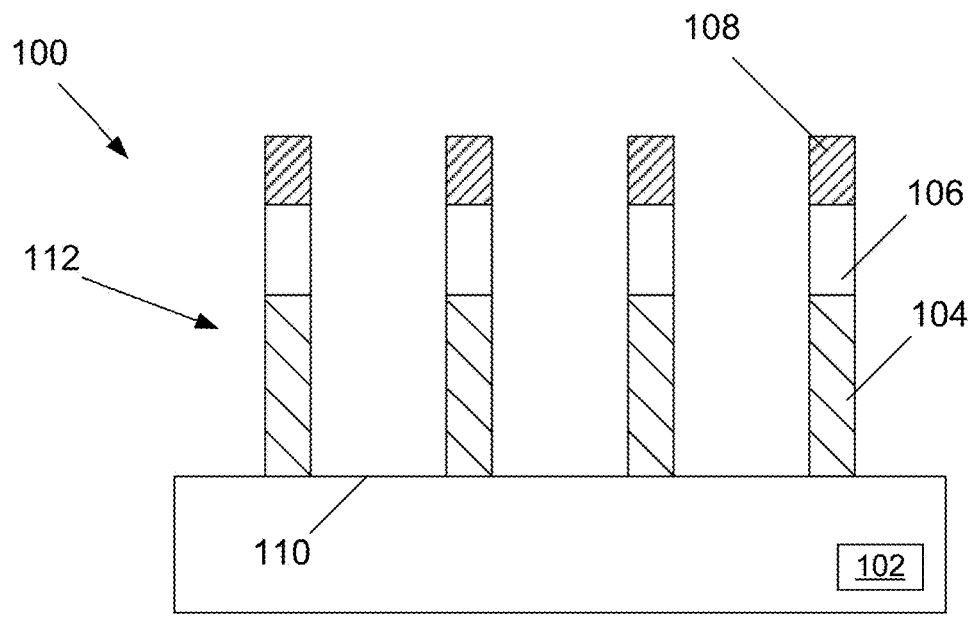

FIG. 2B depicts the product 100 after one or more etching processes, such as dry or wet etching processes, were performed through the patterned mask layer 108, the layer of semiconductor material 106 and the germanium-containing semiconductor material layer 104 so as to form a plurality of fin-formation trenches 110. This operation results in the definition of a plurality of composite fins 112, each of which are comprised of a portion of the germanium-containing semiconductor material layer 104 and a portion of the layer of semiconductor material 106. The overall size, shape and configuration of the fin-formation trenches 110 and the composite fins 112 may vary depending on the particular application. The depth and width of the fin-formation trenches 110 may vary depending upon the particular application. In one illustrative embodiment, based on current day technology, the depth of the fin-formation trenches 110 may range from approximately 30-150 nm and the width of the fin-formation trenches 110 may range from about 20-50 nm. In some embodiments, the composite fins 112 may have a final width within the range of about 5-30 nm. In the illustrative example depicted herein, the fin-formation trenches 110 and composite fins 112 are all of a uniform size and shape. However, as discussed more fully below, such uniformity in the size and shape of the fin-formation trenches 110 and the composite fins 112 is not required to practice at least some aspects of the inventions disclosed herein. In the example depicted herein, the fin-formation trenches 110 are depicted as having been formed by performing an anisotropic etching process that results in the fin-formation trenches 110 having a schematically depicted, generally rectangular configuration. In an actual real-world device, the sidewalls of the fin-formation trenches 110 may be somewhat inwardly tapered, although that configuration is not depicted in the drawings. In some cases, the fin-formation trenches 110 may have a reentrant profile near the bottom of the fin-formation trenches 110. To the extent the fin-formation trenches 110 are formed by performing a wet etching process, the trenches 110 may tend to have a more rounded configuration or non-linear configuration as compared to the generally rectangular configuration of the trenches 110 that are formed by performing an anisotropic etching process. Thus, the size and configuration of the trenches 110, and the manner in which they are made, should not be considered a limitation of the present invention. For ease of disclosure, only the substantially rectangular fin-formation trenches 110 will be depicted in subsequent drawings.

Figure 2C:
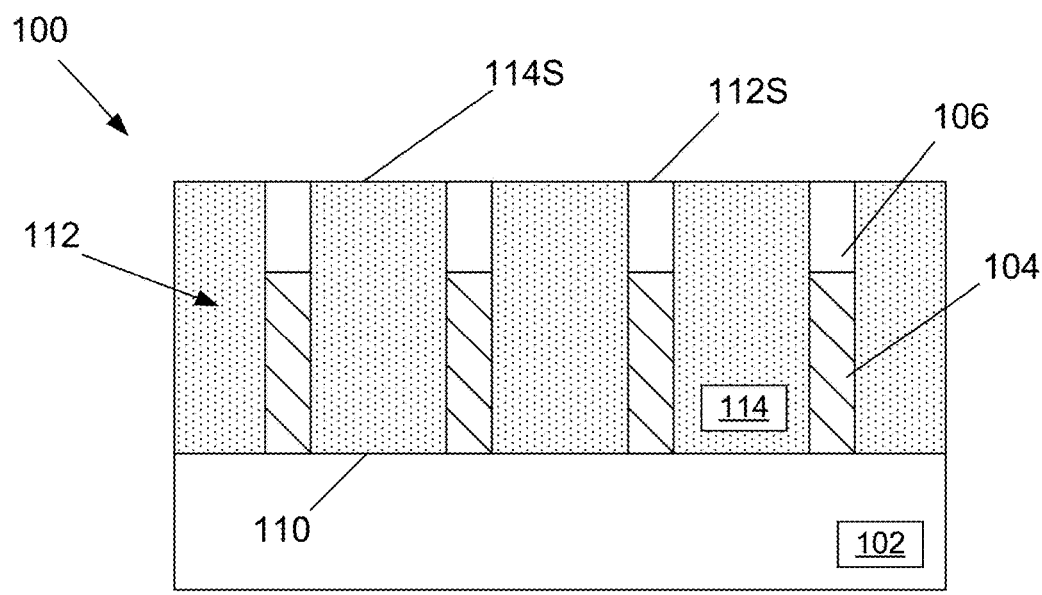

FIG. 2C depicts the product 100 after several process operations were performed. First, a layer of insulating material 114 was formed so as to over-fill the trenches 110. Thereafter, one or more chemical mechanical polishing (CMP) processes were performed to planarize the surface 114S using the composite fins 112 as a polish-stop layer. This effectively removes the patterned hard mask layer 108. After such a CMP process, the surface 114S of the layer of insulating material 114 is substantially level with the upper surface 112S of the composite fins 112. The layer of insulating material 114 may be comprised of a variety of different materials, such as silicon dioxide, a flowable oxide, etc., and it may be formed by performing a variety of techniques, e.g., CVD, spin-coating, etc. Typically, the layer of insulating material 114 is substantially free of germanium as initially formed.

Figure 2D:
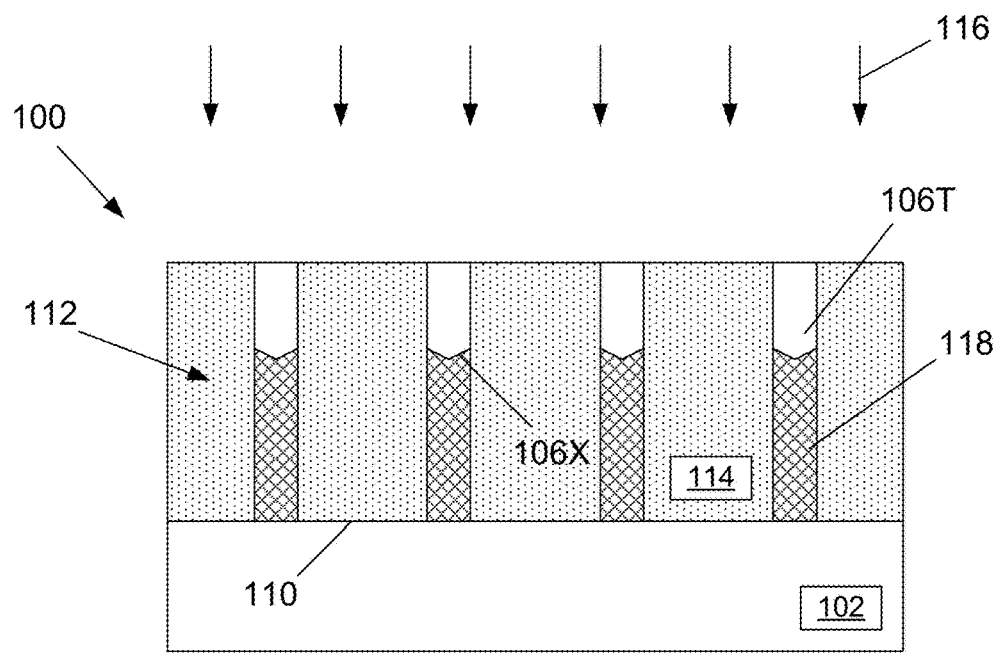

FIG. 2D depicts the product 100 after a thermal anneal process 116 was performed on the product 100 so as to form germanium-containing oxide fin isolation regions 118 under each of the layer of semiconductor material 106 portions of the composite fins 112. The remaining portions of the layer of semiconductor material 106 are the final, tensile-strained fins 106T for the FinFET devices. The final fins 106T are tensile-strained fins. In general, the thermal anneal process 116 is performed under conditions such that substantially all of the portions of the composite fins 112 comprised of the germanium-containing semiconductor material layer 104 are converted into the depicted germanium-containing fin isolation regions 118, e.g., germanium-oxide. The downward-facing faceted end 106X on the bottom of the final fin 106T is due to the crystallographic orientation of the material 106. The parameters of the thermal anneal process 116 may vary depending upon the particular application. In one illustrative embodiment, the thermal anneal process 116 may be performed at a temperature that falls within the range of about 400-1200° C. in an oxidizing processing ambient (wet or dry). The thermal anneal process 116 may be performed using an RTA furnace, a laser anneal process or a traditional furnace, depending upon the particular application. The duration of the thermal anneal process 116 may vary depending upon a variety of factors, e.g., it may range from nanoseconds to hours depending upon the particular processing tools and techniques used to perform the anneal process 116, such as an RTA chamber or a traditional furnace. Additionally, the rate of oxidation may be controlled or "tuned" by controlling the thickness of the layer of insulating material 114. It is anticipated that, in all cases, the layer of insulating material 114 will be deposited such that its upper surface is positioned above at least the upper surface 112S of the composite fins 112. In general, the layer of insulating material 114 should be deposited such that its upper surface is positioned approximately level or higher than the upper surface of the portion 104 of the composite fins 112. However, to control the rate of oxidation, the layer of insulating material 114 may be deposited to an even greater thickness (as shown in FIG. 2D) to reduce the rate of oxidation of the portions 104 of the composite fins 112. During the anneal process, some of the germanium in the portions 104 of the composite fins 112 will diffuse somewhat into the layer of insulating material 114, e.g., silicon dioxide, but there should still be clearly defined regions of germanium-oxide (positioned under the fins 106T) and silicon dioxide (the original layer 114) with a transition region therebetween.

Figure 2E:
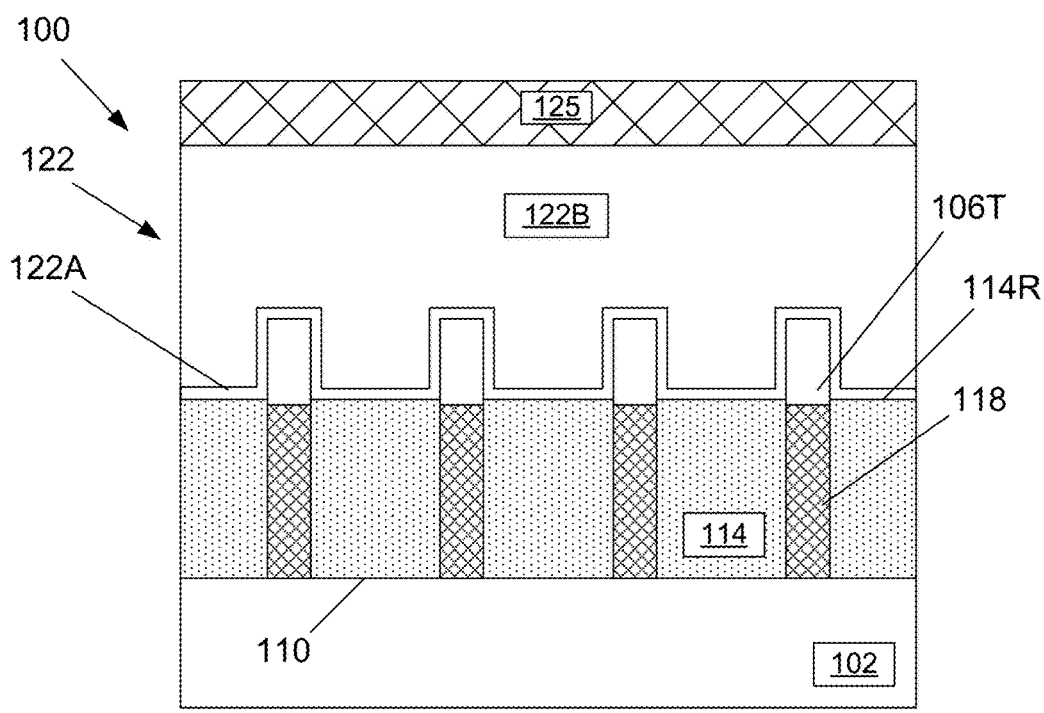

At this point in the process flow, traditional manufacturing techniques may be performed to complete the fabrication of the FinFET devices for the product 100. Accordingly, FIG. 2E depicts the product 100 after several process operations were performed. First, an etching process was performed on the layer of insulating material 114 to reduce its thickness and thereby result in the layer of insulating material 114 having a recessed surface 114R that exposes the final fin height of the tensile-strained final fins 106T. The final fin height may vary depending upon the particular application and, in one illustrative embodiment, may range from about 5-50 nm. Next, an illustrative gate structure 122 was formed on the FinFET device. In one illustrative embodiment, the schematically depicted gate structure 122 includes an illustrative gate insulation layer 122A and an illustrative gate electrode 122B. The gate insulation layer 122A may be comprised of a variety of different materials, such as, for example, silicon dioxide, a so-called high-k (k greater than 10) insulation material (where k is the relative dielectric constant), etc. Similarly, the gate electrode 122B may also be of a material such as polysilicon or amorphous silicon, or it may be comprised of one or more metal layers that act as the gate electrode 122B. As will be recognized by those skilled in the art after a complete reading of the present application, the gate structure 122 of the FinFET devices depicted in the drawings, i.e., the gate insulation layer 122A and the gate electrode 122B, is intended to be representative in nature. That is, the gate structure 122 may be comprised of a variety of different materials and it may have a variety of configurations, and the gate structure 122 may be sacrificial gate structures or final gate structures, i.e., the gate structures of the FinFET devices disclosed herein may be made using either the so-called "gate-first" or "replacement gate" techniques. In one illustrative embodiment, as shown in FIG. 2E, a conformal deposition process may be performed to form a gate insulation layer 122A comprised of a material such as, for example, hafnium oxide, a high-k (k value greater than 10) insulating material, etc., on the tensile-strained fins 106T. Also depicted in FIG. 2E is an illustrative gate cap layer 125 (e.g., silicon nitride) for the gate structure 122.

Figure 2F:
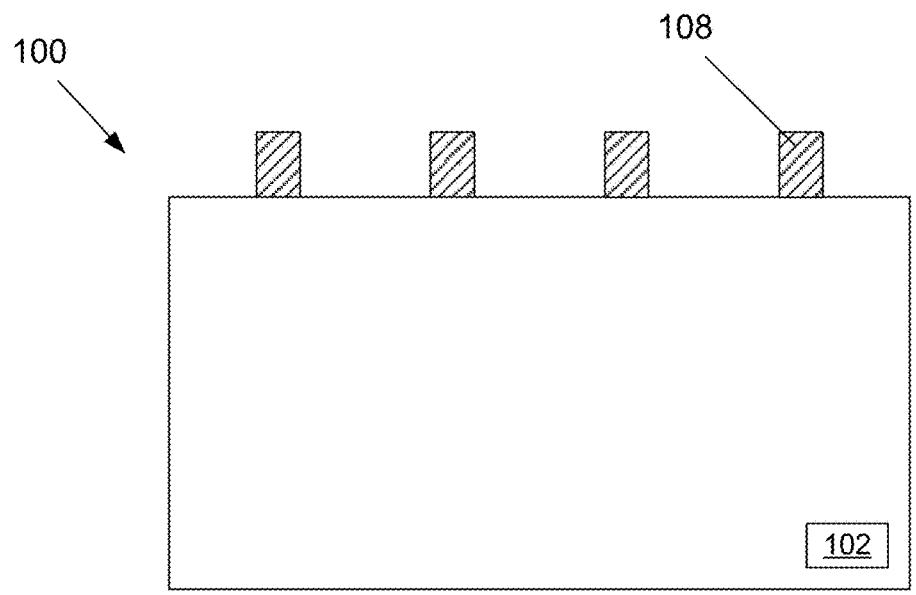

FIGS. 2F-2I depict an alternative manufacturing technique for forming the tensile-strained fins 106T. FIG. 2F depicts the product 100 after the above-described patterned hard mask layer 108 was formed above the substrate 102.

Figure 2G:
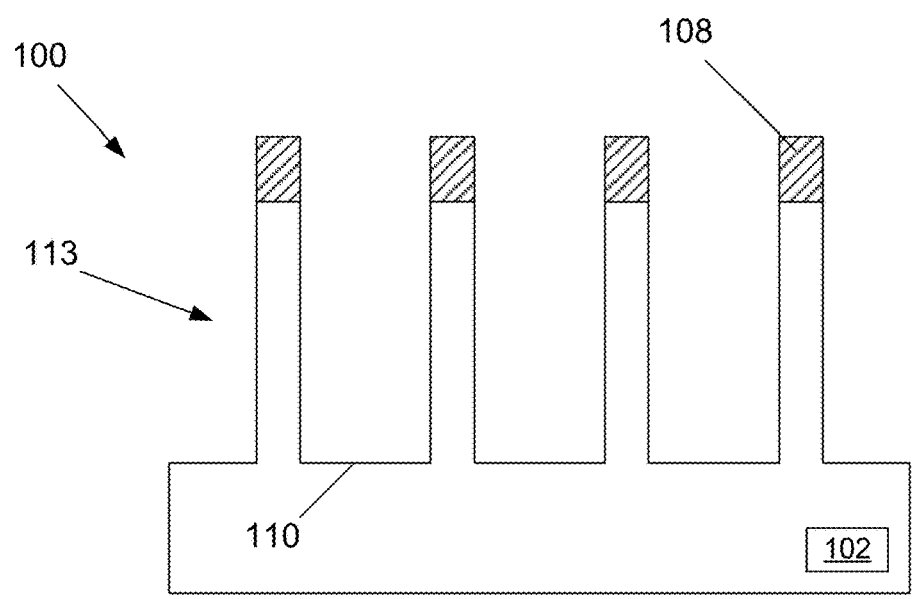

FIG. 2G depicts the product 100 after one or more etching processes were performed on the substrate 102 through the patterned mask layer 108 to form the above-described fin-formation trenches 110. This etching process results in the definition of a plurality of substrate fins 113. As before, the overall size, shape and configuration of the fin-formation trenches 110 and the substrate fins 113 may vary depending on the particular application.

Figure 2H:
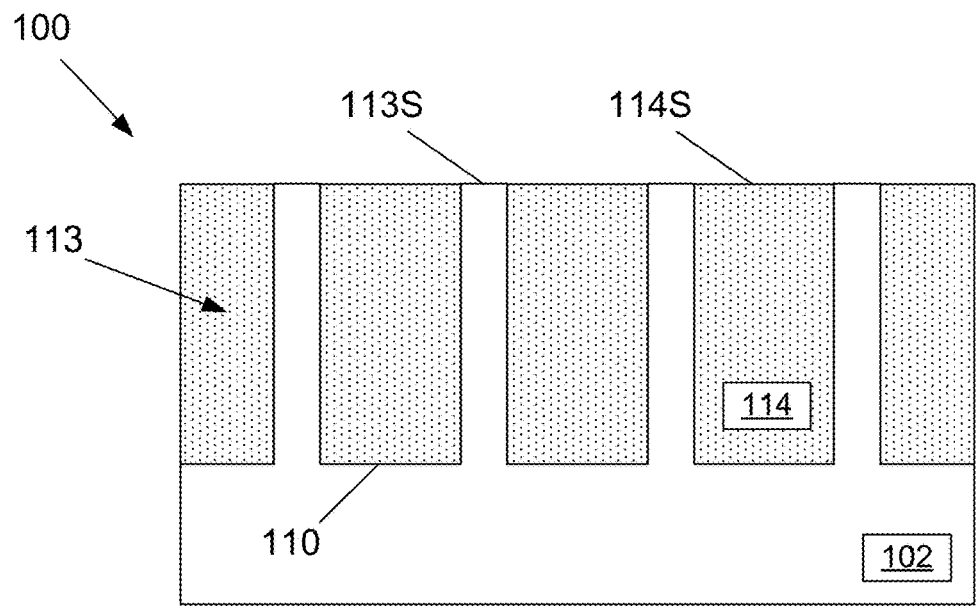

FIG. 2H depicts the product 100 after several process operations were performed. First, the above-described layer of insulating material 114 was formed so as to over-fill the trenches 110. Thereafter, one or more chemical mechanical polishing (CMP) processes were performed to planarize the upper surface 114S using the substrate fins 113 as a polish-stop. This operation removes the patterned mask layer 108. After such a CMP process, the upper surface 114S of the layer of insulating material 114 is substantially level with the upper surface 113S of the substrate fins 113.

Figure 2I:
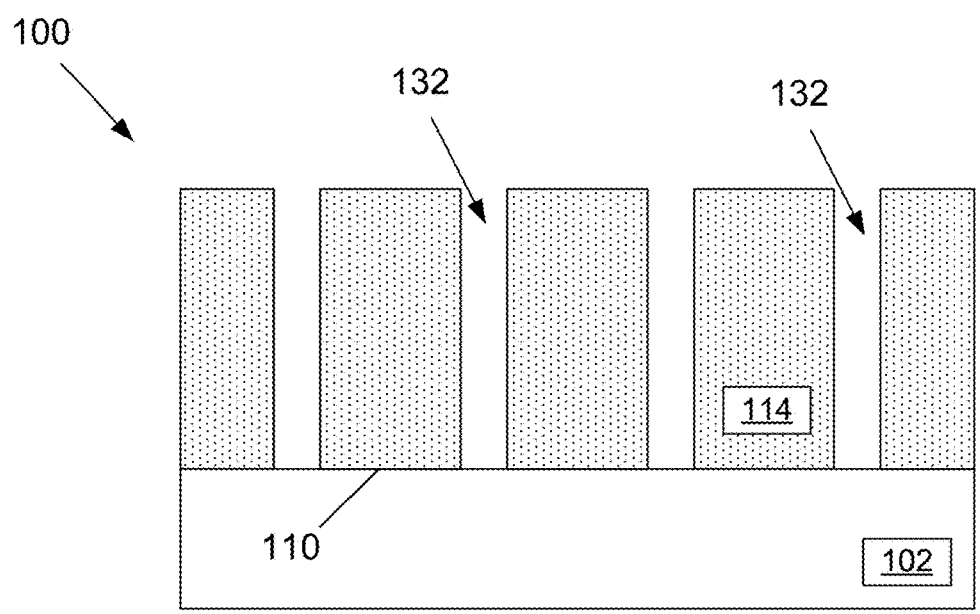

Then, as shown in FIG. 2I, a timed, recess etching process was performed to recess the substrate fins 113. The magnitude of the recessing of the substrate fins 113 may vary depending on the particular application. This process operation results in the formation of a plurality of recessed fin cavities 132.

Figure 2J:
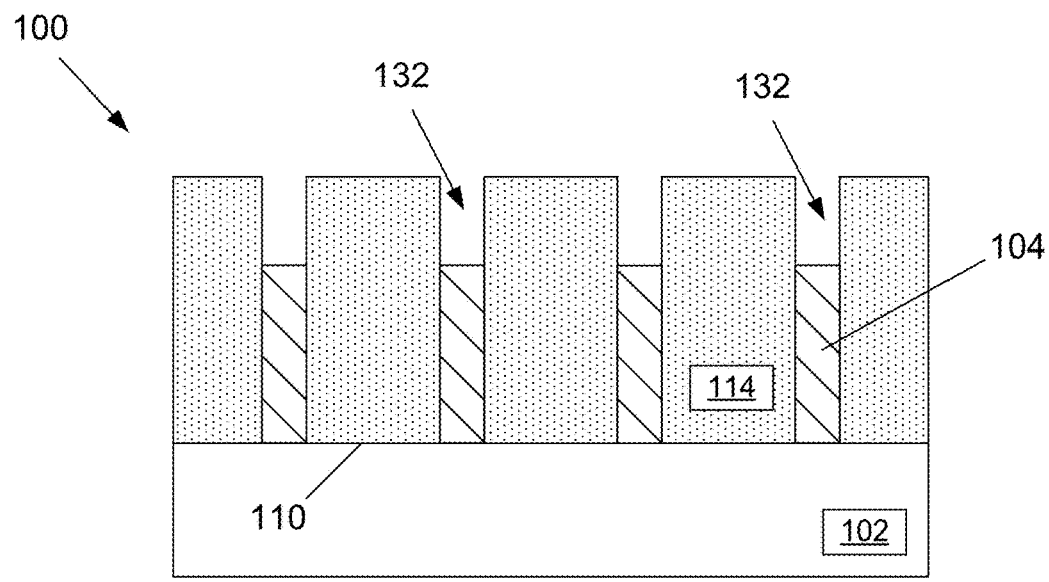

FIG. 2J depicts the product 100 after an epi deposition process was formed to form the above-described, fully relaxed, germanium-containing semiconductor material layer 104 in the fin cavities 132 on the substrate 102 or any remaining portion of the substrate fins 113.

Figure 2K:
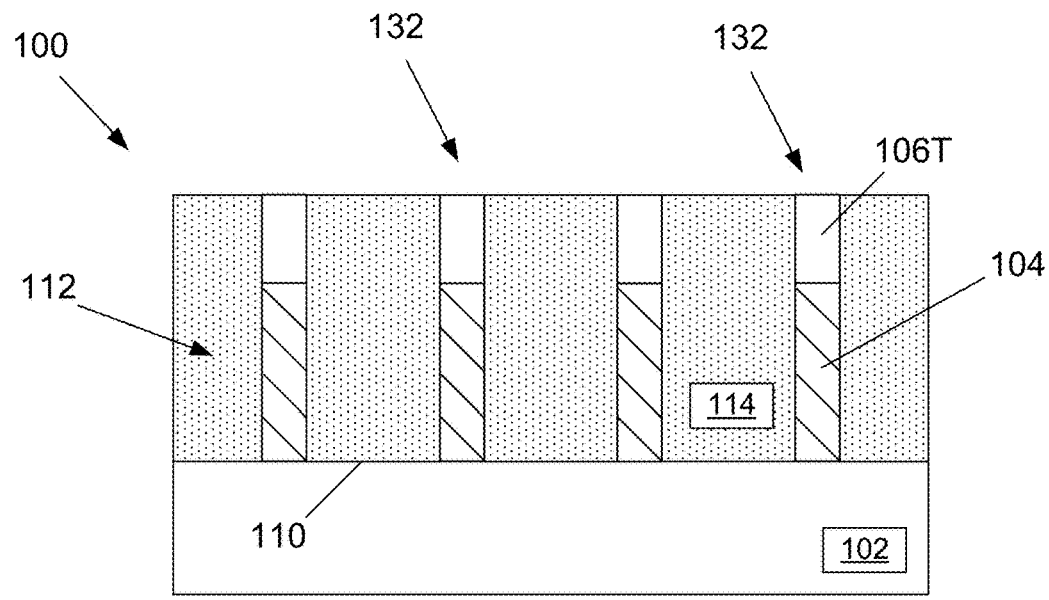

FIG. 2K depicts the product 100 after the final tensile-strained fins 106T comprised of the above-described layer of semiconductor material 106 were formed in the cavities 132 on the upper surface of the fully relaxed, germanium-containing semiconductor material layer 104. Note that this is the same composite fin structure 112 as previously described. At this point in the process flow, the process operations described above in FIGS. 2D-2E may be performed to complete the FinFET device. That is, the above-described anneal process 116 may be performed to define the above-described germanium-containing oxide region 118, and then the above-described gate structure 122 may be formed on the device.

Figure 3A:
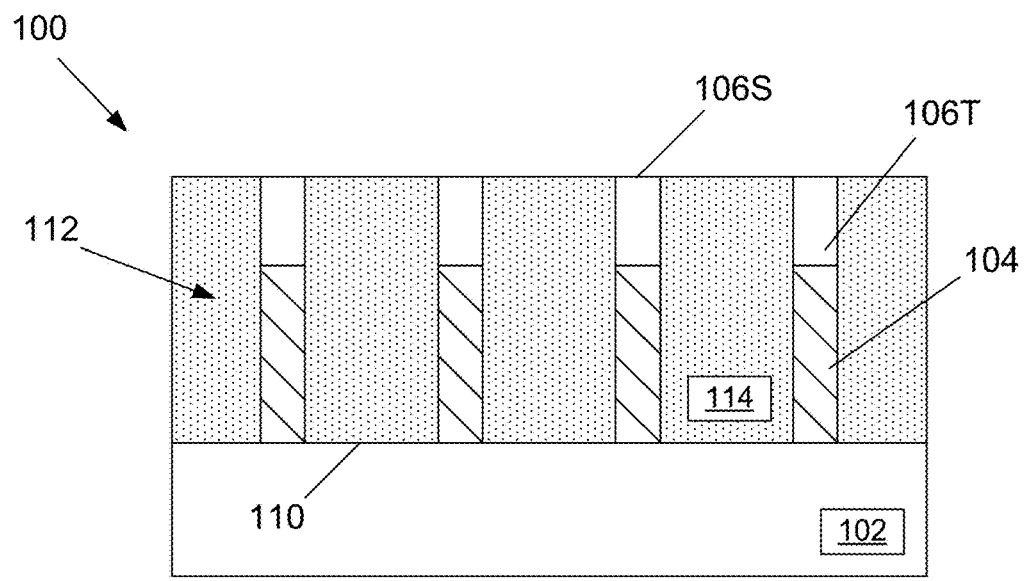
FIGS. 3A-3F depict various illustrative methods disclosed herein for forming fin isolation regions under tensile-strained fins on FinFET semiconductor devices in CMOS applications.

FIGS. 3A-3F depict various illustrative methods disclosed herein for forming fin isolation regions under tensile-strained fins and compressively-strained fins on FinFET semiconductor devices in CMOS applications. FIG. 3A depicts the product 100 at a point in processing that corresponds to that shown in either FIG. 2C or 2K, depending upon the manufacturing technique selected.

Figure 3B:
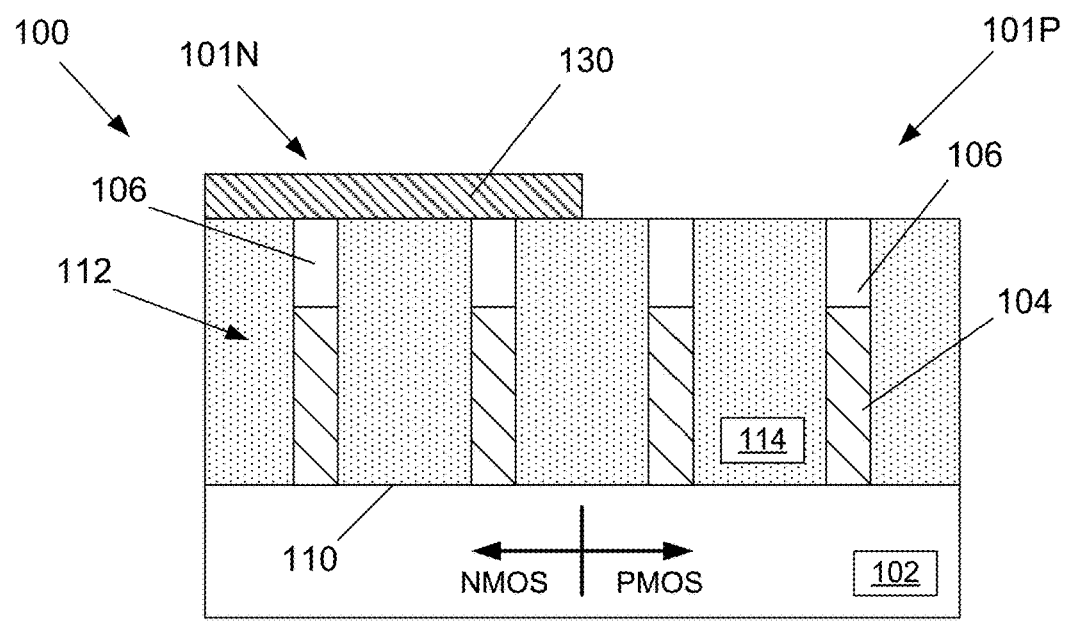

FIG. 3B depicts the product after a patterned mask layer 130, e.g., silicon nitride, is formed so as to mask the two left-most fins 106 for the NMOS device 101N while exposing the two right-most fins 106 for the PMOS device 101P for further processing. At this point, all of the fins 106 are tensile-strained.

Figure 3C:
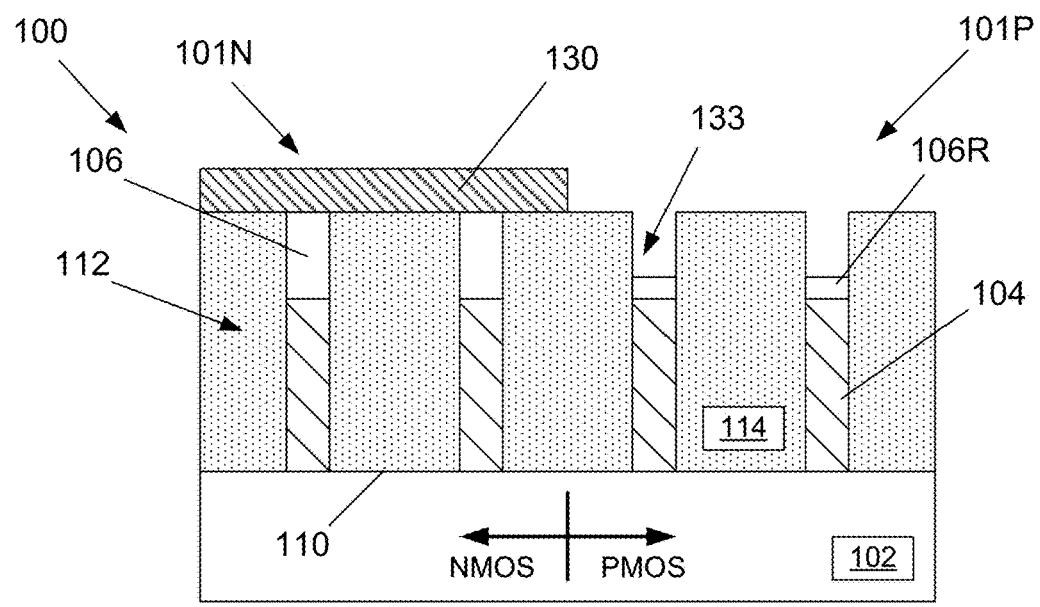

FIG. 3C depicts the product 100 after a timed, recess etching process was performed to recess the fins 106 for the PMOS device 101P. The magnitude of the recessing of the fins 106 may vary depending on the particular application. This process operation results in the formation of a plurality of recessed fin cavities 133 above the recessed fins 106R. The recessed fins 106R and the fins 106 remain tensile-strained at this point in the process flow.

Figure 3D:
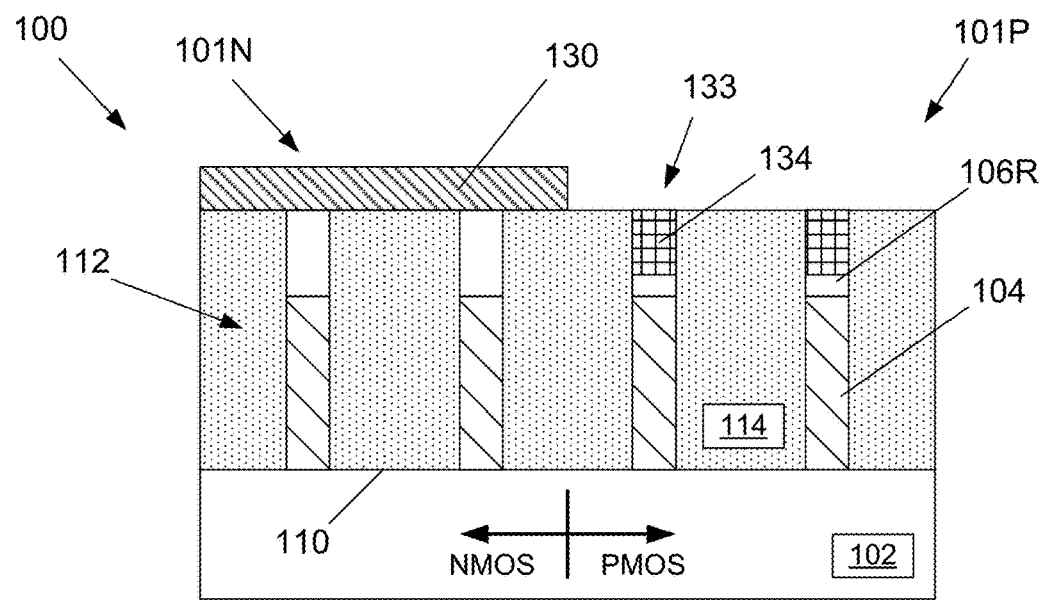

FIG. 3D depicts the product 100 after an epi deposition process was performed to form a germanium-containing semiconductor material 134 on the recessed fins 106R for the PMOS device 101P. In general, in the case where the substrate 102 is made of silicon, the germanium concentration of the layer of semiconductor material 134 will be at least 10% greater than the germanium concentration of the germanium-containing semiconductor material layer 104 so as to thereby induce a compressive strain in the layer of semiconductor material 134 when it is formed. In one embodiment, the germanium concentration of the layer of semiconductor material 134 should be about 10-80% greater than the germanium concentration of the germanium-containing semiconductor material layer 104 such that the layer of semiconductor material 134 will be formed with the desired level of compressive strain. In one particular embodiment, the germanium-containing semiconductor material layer 104 may be a fully relaxed layer of silicon-germanium ($SiGe_{0.5}$), while the layer of semiconductor material 134 may be a layer of silicon-germanium that contains a greater concentration of germanium, e.g., $SiGe_{0.75}$. Based upon the lattice constants of the various layers of material, and the fully relaxed nature of the germanium-containing semiconductor material layer 104, the layer of semiconductor material 134 will be formed with a compressive strain. The magnitude of the compressive strain on the layer 134 will depend upon a variety of factors, including how much more germanium is contained in the layer 134 relative to the layer 104. Among other factors, the greater the difference in germanium concentration, the greater will be the magnitude of the compressive strain on the layer of material 134 to the lattice mismatch between the materials 104 and 134.

Figure 3E:
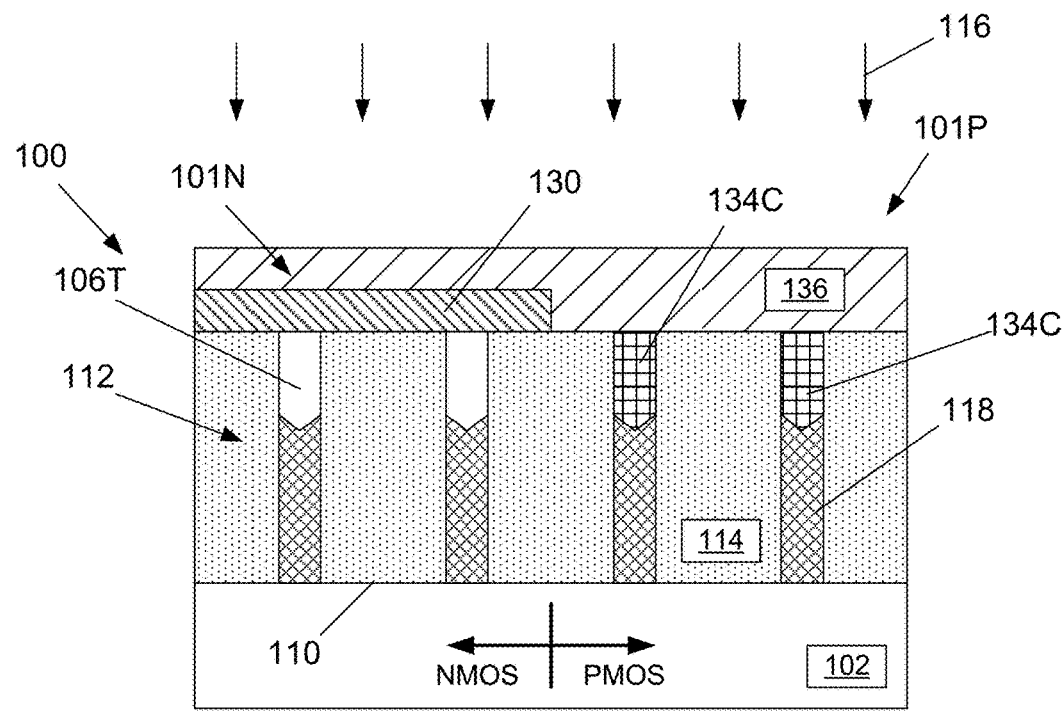

FIG. 3E depicts the product 100 after several process operations were performed. First, a layer of insulating material 136, e.g., silicon dioxide, was formed on the product. Thereafter, the above-described anneal process 116 was performed to define the above-described germanium-containing oxide fin isolation regions 118 under the above-described tensile-strained fins 106T for the NMOS device 101N and under the compressive-strained fins 134C for the PMOS device 101P.

Figure 3F:
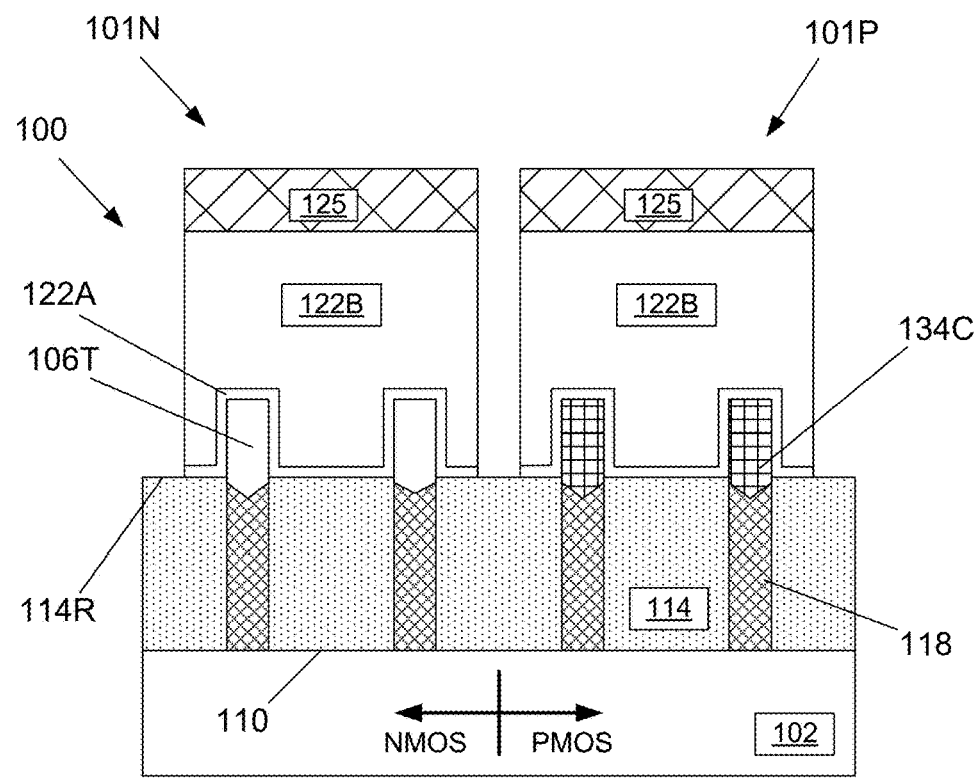

At this point in the process flow, traditional manufacturing techniques may be performed to complete the fabrication of the FinFET devices for the product 100. Accordingly, FIG. 3F depicts the product 100 after several process operations were performed. First, an etching process was performed on the layer of insulating material 114 to reduce its thickness and thereby result in the layer of insulating material 114 having a recessed surface 114R that exposes the final fin height of the tensile-strained final fins 106T and the compressive strained fins 134C. Next, the above-described gate structures 122 were formed for the NMOS device 101N and the PMOS device 101P. Of course, the materials of construction for these gate structures will be different. Also depicted are illustrative gate cap layers 125 (e.g., silicon nitride) for the gate structure 122.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a composite fin structure that is at least partially positioned in a layer of insulating material formed above a semiconductor substrate material, said composite fin structure comprising a first germanium-containing semiconductor material having a first concentration of germanium positioned on a surface of said semiconductor substrate material and a tensile-strained second semiconductor material positioned on a surface of said first germanium-containing semiconductor material, wherein a concentration of germanium in said second semiconductor material is less than said first concentration of germanium and sidewalls of said first germanium-containing semiconductor material are entirely covered by said layer of insulating material;
    performing a thermal anneal process to convert all of said first germanium-containing semiconductor material of said composite fin structure that has sidewalls entirely covered by said layer of insulating material into a germanium-containing oxide isolation region positioned under said second semiconductor material of said composite fin structure, wherein said second semiconductor material is a tensile-strained final fin for an NMOS FinFET device; and
    forming one of a final gate structure or a sacrificial gate structure comprised of a gate insulation layer and a gate electrode around and covering a portion of said second semiconductor material positioned directly over and above said germanium-containing oxide isolation region after performing said thermal anneal process.

2. The method of claim 1, wherein said layer of insulating material is formed such that it is substantially free of germanium prior to said performing said thermal anneal process.

3. The method of claim 1, wherein said semiconductor substrate material is made of silicon, said first germanium-containing semiconductor material is made of silicon-germanium $Si_xGe_{(1-x)}$ (where x ranges from zero to about 0.75) and said second semiconductor material is comprised of substantially pure silicon.

4. The method of claim 1, wherein said first germanium-containing semiconductor material is a fully relaxed layer of silicon-germanium ($SiGe_{0.5}$) and said second semiconductor material is a layer of substantially pure silicon that is substantially free of germanium.

5. The method of claim 1, wherein the germanium concentration in said second semiconductor is at least 15-60% less than said first germanium concentration.

6. The method of claim 1, wherein said first germanium-containing semiconductor material is formed to a thickness that is greater than its critical thickness.

7. The method of claim 1, wherein said performing said thermal anneal process comprises performing an anneal process at a temperature that falls within a range of about 400-1200° C. in an oxidizing ambient.

8. The method of claim 1, wherein said forming said composite fin structure that is at least partially positioned in said layer of insulating material formed above said semiconductor substrate material comprises:
depositing said first germanium-containing semiconductor material on an upper surface of said semiconductor substrate material;
depositing said second semiconductor material on an upper surface of said first germanium-containing semiconductor material;
forming a patterned etch mask above said second semiconductor material;
performing at least one etching process though said patterned etch mask so as to form a plurality of fin-formation trenches that extend through said second semiconductor material, said first germanium-containing semiconductor material and into said semiconductor substrate material so as to define said composite fin structure; and
forming said layer of insulating material in said fin-formation trenches so as to cover at least said first germanium-containing semiconductor material portion of said composite fin structure.

9. The method of claim 1, wherein said forming said composite fin structure that is at least partially positioned in said layer of insulating material formed above said semiconductor substrate material comprises:
forming a plurality of fin-formation trenches in said semiconductor substrate material so as to define a substrate fin comprised of said semiconductor substrate material;
forming said layer of insulating material in said fin-formation trenches such that it covers substantially all sidewalls of said substrate fin while leaving an upper surface of said substrate fin exposed;
performing a recess etching process on said substrate fin to remove at least portions of said substrate fin and thereby form a fin cavity that is laterally defined by said layer of insulating material;
forming said first germanium-containing semiconductor material in said fin cavity on any remaining portion of said substrate fin or said semiconductor substrate material; and
forming said second semiconductor material in said fin cavity on said first germanium-containing semiconductor material.

10. A method, comprising:
forming a composite fin structure that is at least partially positioned in a layer of insulating material formed above a semiconductor substrate material, said composite fin structure comprising a first germanium-containing semiconductor material positioned on a surface of said semiconductor substrate material and a second tensile-strained semiconductor material positioned on a surface of said first germanium-containing semiconductor material, wherein said first germanium-containing semiconductor material is fully relaxed in at least one direction, has a thickness greater than its critical thickness and has a first concentration of germanium, sidewalls of said first germanium-containing semiconductor material are entirely covered by said layer of insulating material, and a concentration of germanium in said second semiconductor material is at least 15-60% less than said first concentration of germanium;
performing a thermal anneal process to convert all of said first germanium-containing semiconductor material of said composite fin structure that has sidewalls entirely covered by said layer of insulating material into a germanium-containing oxide isolation region positioned under said second semiconductor material of said composite fin structure, wherein said second semiconductor material is a tensile-strained final fin for an NMOS FinFET device; and
forming one of a final gate structure or a sacrificial gate structure comprised of a gate insulation layer and a gate electrode around and covering a portion of said second semiconductor material positioned directly over and above said germanium-containing oxide isolation region after performing said thermal anneal process.

11. The method of claim 10, wherein said layer of insulating material is formed such that it is substantially free of germanium prior to said performing said thermal anneal process.

12. The method of claim 10, wherein said semiconductor substrate material is made of silicon, said first germanium-containing semiconductor material is made of silicon-germanium $Si_xGe_{(1-x)}$ (where x ranges from zero to about 0.75), and said second semiconductor material is comprised of substantially pure silicon.

13. The method of claim 10, wherein said first germanium-containing semiconductor material is a layer of silicon-germanium ($SiGe_{0.5}$) and said second semiconductor material is a layer of substantially pure silicon that is substantially free of germanium.

14. The method of claim 10, wherein said performing said thermal anneal process comprises performing an anneal process at a temperature that falls within a range of about 400-1200° C. in an oxidizing ambient.

15. A method, comprising:
forming first and second composite fin structures positioned in a layer of insulating material formed above a semiconductor substrate material, each of said composite fin structures comprising a first germanium-containing semiconductor material having a first concentration of germanium positioned on a surface of said semiconductor substrate material and a second tensile-strained semiconductor material positioned on a surface of said first germanium-containing semiconductor material, wherein a concentration of germanium in said second semiconductor material is less than said first concentration of germanium and sidewalls of said first germanium-containing semiconductor material are entirely covered by said layer of insulating material;

forming a masking layer that covers said first composite fin structure but not said second composite fin structure;

with said masking layer in position, performing a recess etching process on said second composite fin structure to remove a portion, but not all, of said second semiconductor material of said second composite fin structure and thereby form a fin cavity that is laterally defined by said layer of insulating material;

forming a second germanium-containing semiconductor material in said fin cavity on said second semiconductor material, wherein a germanium concentration of said second germanium-containing semiconductor material is greater than said first germanium concentration and said second germanium-containing semiconductor material is formed with a compressive strain;

forming another layer of insulating material above at least said second germanium-containing semiconductor material;

performing a thermal anneal process to convert all of said first germanium-containing semiconductor material of said first and second composite fin structures having sidewalls entirely covered by said layer of insulating material into germanium-containing oxide isolation regions, one of which is positioned under said second semiconductor material of said first composite fin structure, wherein said second semiconductor material is a tensile-strained final fin for an NMOS FinFET device, and the other of which is positioned under said second germanium-containing semiconductor material, wherein said second germanium-containing semiconductor material is a compressive-strained final fin for a PMOS FinFET device; and forming a first gate structure around a portion of said tensile-strained final fin for said NMOS FinFET device positioned directly above said germanium-containing oxide isolation region and forming a second gate structure around and covering a portion of said compressive-strained final fin for said PMOS FinFET device positioned directly over and above said germanium-containing oxide isolation region after performing said thermal anneal process.

16. The method of claim 15, further comprising, after forming said germanium-containing oxide isolation regions, forming a first gate structure around a portion of said tensile-strained final fin for said NMOS FinFET device and forming a second gate structure around a portion of said compressive-strained final fin for said PMOS FinFET device.

17. The method of claim 15, wherein said layer of insulating material is formed such that it is substantially free of germanium prior to said performing said thermal anneal process.

18. The method of claim 15, wherein said first germanium-containing semiconductor material is a fully relaxed layer of silicon-germanium ($SiGe_{0.5}$), said second semiconductor material is a layer of substantially pure silicon that is substantially free of germanium, and said second germanium-containing semiconductor material is ($SiGe_{0.75}$).

19. The method of claim 15, wherein the germanium concentration in said second semiconductor is at least 15-60% less than said first germanium concentration.

20. The method of claim 15, wherein said first germanium-containing semiconductor material is formed to a thickness that is greater than its critical thickness.

21. The method of claim 15, wherein the germanium concentration in said second germanium-containing semiconductor material is at least 10% greater than said first germanium concentration.

22. The method of claim 15, wherein said performing said thermal anneal process comprises performing an anneal process at a temperature that falls within a range of about 400-1200° C. in an oxidizing ambient.

* * * * *